United States Patent
Gerrish et al.

(10) Patent No.: US 7,196,889 B2
(45) Date of Patent: Mar. 27, 2007

(54) ZENER TRIGGERED OVERVOLTAGE PROTECTION DEVICE

(75) Inventors: Paul F Gerrish, Phoenix, AZ (US); Tyler J Mueller, Phoenix, AZ (US); Andreas A. Fenner, Chandler, AZ (US); Mark Blanchfield, Scottsdale, AZ (US)

(73) Assignee: Medtronic, Inc., Minneapolis, MN (US)

( * ) Notice: Subject to any disclaimer, the term of this patent is extended or adjusted under 35 U.S.C. 154(b) by 180 days.

(21) Appl. No.: 10/298,134

(22) Filed: Nov. 15, 2002

(65) Prior Publication Data

US 2004/0095698 A1   May 20, 2004

(51) Int. Cl.
   *H02H 9/00*   (2006.01)
(52) U.S. Cl. ........................... 361/91.1; 361/56
(58) Field of Classification Search ............ 361/56–58, 361/91.1, 111; 257/355–360
   See application file for complete search history.

(56) References Cited

U.S. PATENT DOCUMENTS

| | | | | |
|---|---|---|---|---|
| 3,427,511 A | * | 2/1969 | Rosenzweig | 257/580 |
| 4,157,561 A | * | 6/1979 | Nawata et al. | 257/580 |
| 4,282,555 A | | 8/1981 | Svedberg | 361/56 |
| 4,319,257 A | * | 3/1982 | Beasom | 257/577 |
| 4,633,283 A | * | 12/1986 | Avery | 257/122 |
| 4,694,315 A | | 9/1987 | Svedberg | 357/23.13 |
| 5,223,737 A | * | 6/1993 | Canclini | 257/546 |
| 5,274,262 A | * | 12/1993 | Avery | 257/362 |
| 5,663,860 A | * | 9/1997 | Swonger | 361/56 |
| 5,808,342 A | * | 9/1998 | Chen et al. | 257/357 |
| 5,982,600 A | * | 11/1999 | Cheng | 361/111 |
| 6,268,639 B1 | * | 7/2001 | Li et al. | 257/577 |
| 6,358,781 B1 | * | 3/2002 | Lee et al. | 438/133 |
| 6,653,689 B2 | * | 11/2003 | Okawa | 257/362 |
| 2002/0021538 A1 | * | 2/2002 | Chen et al. | 361/56 |

* cited by examiner

*Primary Examiner*—Brian Sircus
*Assistant Examiner*—Danny Nguyen
(74) *Attorney, Agent, or Firm*—Carol F. Barry; Girma Wolde-Michael

(57) ABSTRACT

An overvoltage protection device is formed in a semiconductor substrate having a plurality of doped regions for forming semiconductor devices. The overvoltage protection device is adapted to draw current away from a device to be protected from excess voltage and has a switchable device having a terminal adapted to be coupled to a potential source of excess voltage and to the semiconductor substrate for drawing current away from the potential source of excess voltage when the switchable device is triggered, and for directing the current to the semiconductor substrate.

A Zener diode is coupled to a second terminal of the switchable device to trigger the switchable device to a conducting state. The Zener diode is formed in the same doped region of the substrate as the trigger of the switchable device.

9 Claims, 3 Drawing Sheets

ZENER TRIGGERED OVERVOLTAGE PROTECTION DEVICE

FIELD OF THE INVENTION

The present invention generally relates to overvoltage protection devices, and more particularly to a Zener diode trigger for such a device.

BACKGROUND OF THE INVENTION

As electromagnetically sensitive implantable medical devices such as defibrillators and pacemakers increase in complexity, the number of interface points to the body, such as attachment points of leads from a cardiac pacemaker or defibrillator to various areas of the heart, also increases. Additionally, as the number of external sources of electromagnetic interference, such as microwave ovens, portable radio transmitters, and the like, increase, their interaction with the implantable medical devices naturally increases as does the need for protection of the sensitive circuitry and external leads of the implantable device against the external sources of electromagnetic interference.

Since the incoming electromagnetic interference energy can arrive unexpectedly as an energy pulse of finite duration and of either positive or negative polarity with respect to the implantable device's circuitry, or as a continuous sinusoidal wave, the protective circuit should be designed to be able to sense and dissipate this incoming energy so that the lead interface input or output circuitry will not be degraded in performance or possibly damaged.

It would be desirable to have the protective device coupled to the circuitry of the implantable device to clamp the incoming energy at a voltage lower than would be destructive to the circuitry of the implantable device (but above the operating voltage of the implantable device, in the case of an output lead of such a device) for shunting the current generated by the external source of energy through an alternate path to the system ground.

SUMMARY OF THE INVENTION

This may be accomplished by providing an overvoltage protection device formed in a semiconductor substrate that includes a plurality of doped regions for forming semiconductor devices. The overvoltage protection device is adapted to draw current away from a device to be protected from excess voltage, and includes a switchable device with a terminal adapted to be coupled to a potential source of excess voltage and to the semiconductor substrate for drawing current away from the potential source of excess voltage when the switchable device is triggered, and for directing the current to the semiconductor substrate.

A Zener diode is coupled to a second terminal of the switchable device to trigger the switchable device to a conducting state, the Zener diode being formed in the same doped region of the substrate as the trigger of the switchable device.

BRIEF DESCRIPTION OF THE DRAWINGS

The present invention will hereinafter be described in conjunction with the appended drawing figures, wherein like numerals denote like elements, and.

DETAILED DESCRIPTION OF THE DRAWINGS

In the following detailed description of the embodiments, reference is made to the accompanying drawings, which form a part hereof, and in which is shown by way of illustration specific embodiments in which the present invention may be practiced in accordance with the present invention. However, it is to be understood that other embodiments may be utilized and structural or logical changes may be made without departing from the scope of the present invention.

Figure 1:
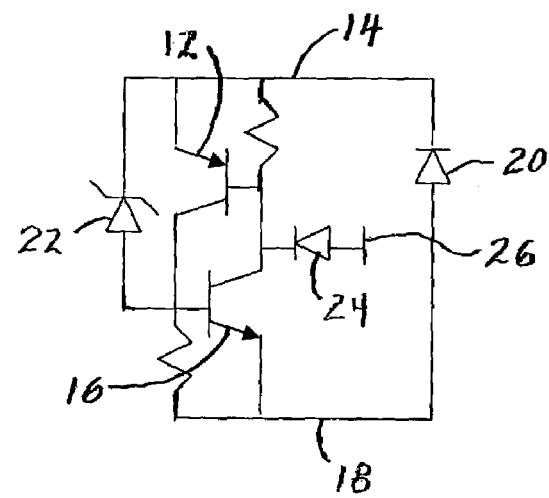
FIG. 1 is a schematic diagram of one circuit in accordance with the invention.

A circuit 10 in accordance with the instant invention is shown in FIG. 1. The circuit is preferably constructed in BiCMOS technology, but other technologies, such as Bipolar or CMOS may be used.

A PNP transistor 12 includes an emitter coupled to the anode 14 of the circuit 10. An NPN transistor 16 includes an emitter coupled to the cathode 18 of the circuit 10 and a collector coupled to the base of PNP transistor 12. The base of PNP transistor 12 is also coupled through a resistor to the cathode 18 of the circuit 10, and the base of NPN transistor 16 is coupled through a Zener diode 22 to the anode of circuit 10. A diode 20 is coupled between the anode 14 and the cathode 18 of circuit 10. The collector of PNP transistor 12 is coupled to the base of NPN transistor 18 and the base of PNP transistor 12 is coupled through a diode 24 to the semiconductor substrate 26 upon which circuit 10 is fabricated The anode 14 of circuit 10 is coupled to a lead of an implantable medical device such as a lead from a cardiac pacemaker or an implantable defibrillator (not shown) the functionality of which lead it is desired to protect from excess voltage caused, for example, by an external source of electromagnetic energy. In practice there are a plurality of circuits 10, each coupled to a different lead or input or output interface of the implantable device. It is also possible to connect more than one circuit 10 to a single sensitive lead of an implantable medical device.

In operation, a high voltage is applied to the anode 14 of the circuit 10 as a result of an external source of electromagnetic energy. As noted above, anode 14 of circuit 10 is coupled to a lead of the implantable device which it is desired to protect. The Zener diode 22 reaches breakdown at a specified point which may be determined by the operating voltage commonly appearing on the lead or other circuitry of the implantable device to which the anode 14 is coupled. For example, if the lead is a cardiac pacemaker lead, the breakdown voltage of the Zener diode 22 must exceed the level of the pacing pulse generated by the pacemaker. As Zener diode 22 breaks down, carriers are injected into the base region of NPN transistor 16. This forward biases the base-emitter junction of the NPN transistor 16 and causes NPN transistor 16 to pull the PNP transistor 12 to a forward conducting state.

The Zener in this case does not break down in a Zener mode, that is, by a tunneling mechanism, but rather it breaks down due to avalanche breakdown. It generally is still referred to as a Zener breakdown, but to avoid confusion as to the actual operation of the circuit 10 this operation of the Zener should be noted.

It should also be noted that the PNP transistor 12 and the NPN transistor 16 are coupled in such a way as to form a silicon controlled rectifier (SCR), with the Zener diode 22 acting as the trigger to cause the SCR to conduct when the Zener breakdown voltage is exceeded by a voltage at anode 14 of circuit 10.

Figure 2:
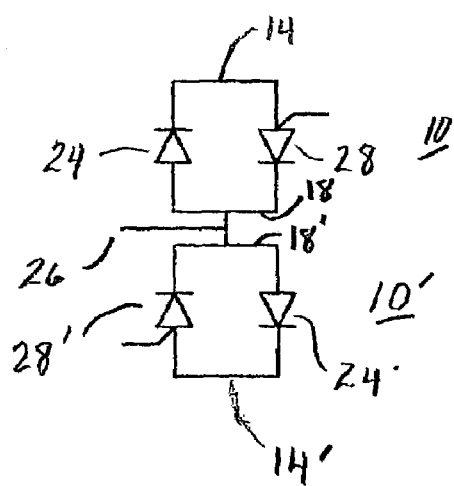
FIG. 2 is a schematic diagram showing the interaction between two of the circuits of FIG. 1.
Figure 3:
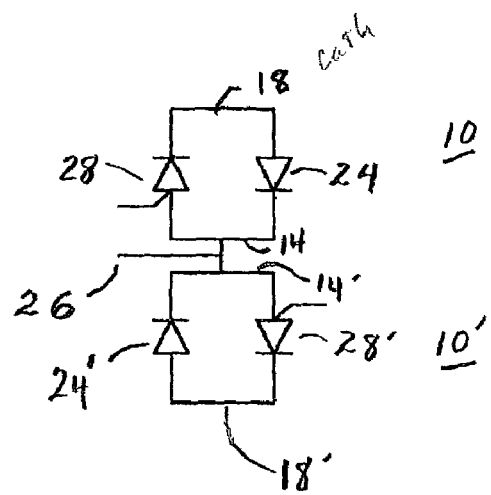
FIG. 3 is a schematic diagram showing an alternate interaction between two of the circuits of FIG. 1.

FIG. 2 and FIG. 3 are schematic diagrams showing the interaction between two of the circuits of FIG. 1. FIG. 2 shows two such circuits connected cathode to cathode and FIG. 3 shows two such circuits connected anode to anode. Each of the circuits 10 and 10' as shown in FIG. 2 and FIG. 3 comprises all of the elements of circuit 10 of FIG. 1, but shown in a simplified schematic form to explain the interaction between two (or, sometimes, more) of the circuits 10. In the schematics of FIG. 2 and FIG. 3 the PNP transistor 12 and the NPN transistor 16 are shown as SCRs 28 and 28'. As can be seen in FIG. 2, each of the anodes 14, 14' would be connected to a lead or circuit of an implantable medical device (not shown). In the event of an excess voltage at anode 14, circuit 10 operates as set forth in the description of the operation of FIG. 1, that is, the Zener diode (22 in FIG. 1, not shown in this view) triggers the SCR 28 and conducts current from the anode 14 to the cathode 18 and to the substrate 26. However, the current which flows into the substrate from cathode 18 will also flow into the cathode 18' of circuit 10'. This current flow forward biases diode 24' since anode 14' of circuit 10' is at a lower potential than anode 14 of circuit 10. If processes other than BiCMOS are used, there may not be a current flow to the substrate.

In FIG. 3, which may be a preferred embodiment, a high voltage electromagnetic interference (EMI) pulse or signal is applied to the lead being protected by the circuit and thereby to the cathode 18. The high voltage forward biases the diode 24. The potential at anode 14, 14' follows the potential at cathode 18 (less a diode drop) until the trigger voltage is reached across the anode 14, 14' to cathode 18'. The triggering mechanism is then as previously described, i.e., the Zener diode (not shown in this FIG. 3) breaks down and injects carriers into the base of the NPN transistor (16 of FIG. 1) shown here as the gate of the SCR 24' which ultimately latches the SCR structure to shunt the EMI pulse, initially seen at cathode 18 away from the critical circuitry it is protecting.

Figure 4:
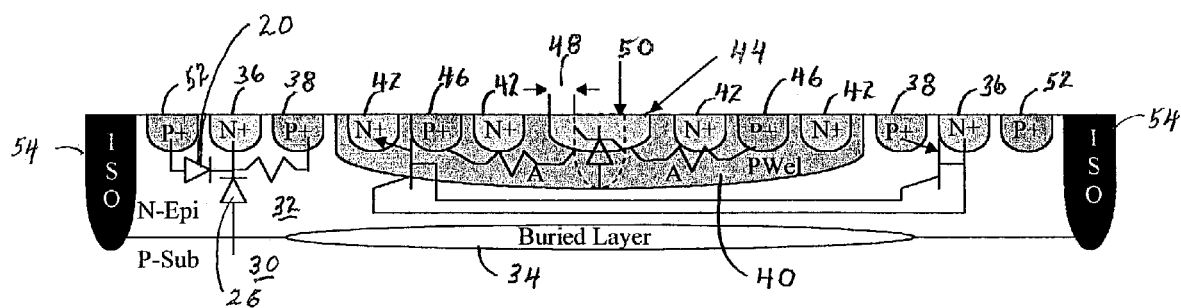
FIG. 4 is a cross-section diagram of a semiconductor structure of the circuit of FIG. 1.
Figure 5:
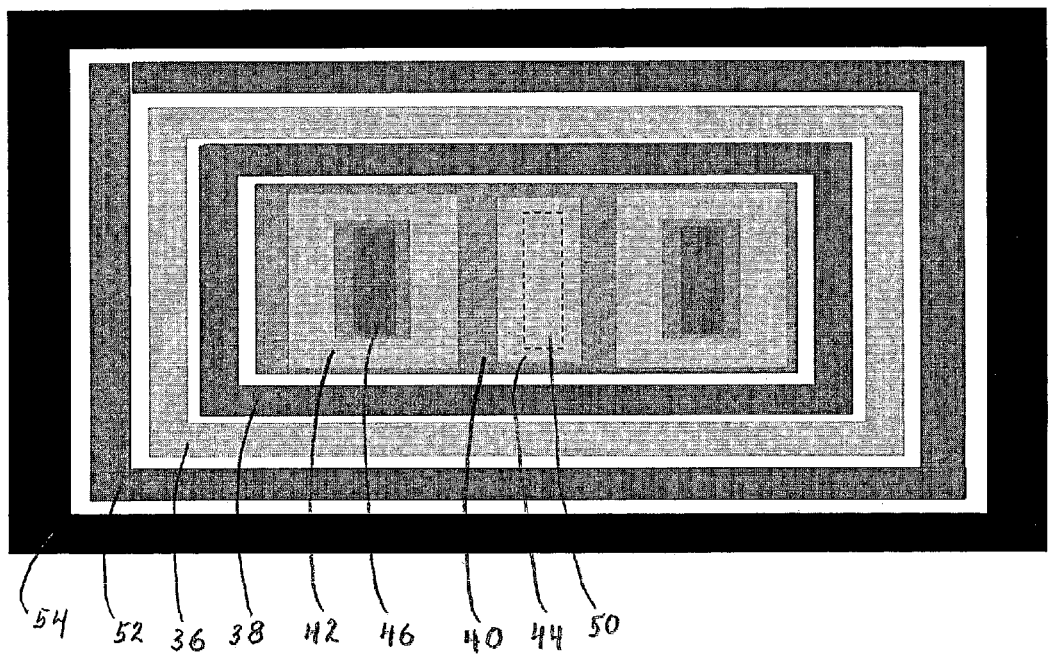
FIG. 5 is a top view of one layout of the circuit of FIG. 1.
Figure 6:
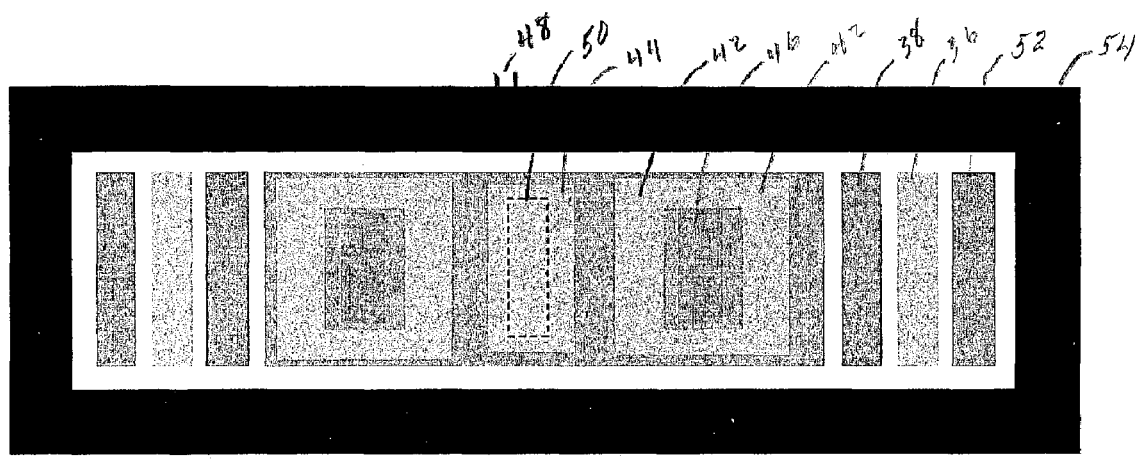
FIG. 6 is a top view of another layout of the circuit of FIG. 1.

FIG. 4 is a cross-section diagram of a semiconductor structure of the circuit of FIG. 1, and FIG. 5 and FIG. 6 are top views of two possible layouts of the circuit of FIG. 1. The contact regions identified in FIG. 4 are shown in FIG. 5 and FIG. 6, and numbered in a like manner to provide clarity of description of the layout which shows a number of contact areas for various device terminals. FIG. 5 shows a layout arranged in a concentric or ringed manner. FIG. 6 shows an alternative layout which will be further described later.

The circuit 10 of FIG. 1 is preferably fabricated in a BiCMOS process, although as previously noted other processes may be used, such as Bipolar or CMOS. For clarity of understanding, the individual elements (transistors, diodes, etc.) are shown in partially schematic form in FIG. 4.

The circuit is constructed in a P-substrate 30 with an N-epitaxial layer 32 atop the P-substrate 32 and buried layer 34. A diode (26 in FIG. 1) is created between the P-substrate 30 and the collector 36 of NPN transistor 16 and base of PNP transistor 12. PNP transistor 12 is a lateral transistor and the emitter of which is formed by the P+ doped region 38, and the collector is firmed by the P-tub 40. The vertical NPN transistor 16 has its base in the P-tub or P-well 40, its emitter in the N+ doped region 42, and its collector in the N-epi layer 32.

The Zener diode (22 in FIG. 1) is formed between the P-tub and the N+ doped region, 44. Because the Zener diode 22 is constructed in the P-tub, that is, in the base region of NPN transistor 16, there results an evenly distributed resistance from the anode of the Zener diode 22 to the base of NPN transistor 16. This causes an even distribution of injected carriers which results in a uniform and fast trigger of the NPN transistor 16. From FIG. 5 and FIG. 6 it can be seen that in both cases the layouts are symmetrical and the doped area 50 creating the Zener diode 22 and the doped areas 42 forming the (multiple) emitters of NPN transistor 16 are equidistant at all points along the length of the Zener diode. This provides a uniform current density out of the Zener diode 22 and causes uniform carrier injection from the emitter of NPN transistor 16 at all points.

The base resistance of NPN transistor 16 is subsurface due to the N+ emitter 42 being laid out symmetrically as shown in FIG. 5 and FIG. 6, enclosing the base contact 46 of the NPN transistor 16. This forces the current to flow beneath and past the emitter 42 resulting in a voltage drop, which causes minority carrier injection from the emitter 42. Once the NPN transistor 16 has turned on, the symmetrical feature of the emitter results in lower overall on resistance of the SCR. The current redistributes from the portion of the emitter 42 closest to the PNP transistor 12.

The Zener diode 22 is designed to have a consistent breakdown voltage. The active region of the device overlaps the Zener portion, thereby creating a more planar breakdown of the diode. The layout minimizes the cylindrical and spherical portions of the diode, where peak electric fields are known to occur as can be seen in the area 48. Contact 52 provides a low resistance diode 20, which may also be formed at the junction between the P-tub 40 and the epi layer 32. The region 54 is an isolation region to separate the protection circuit 10 from other similar circuits which may be fabricated on the same semiconductor substrate 30.

Figure 7:
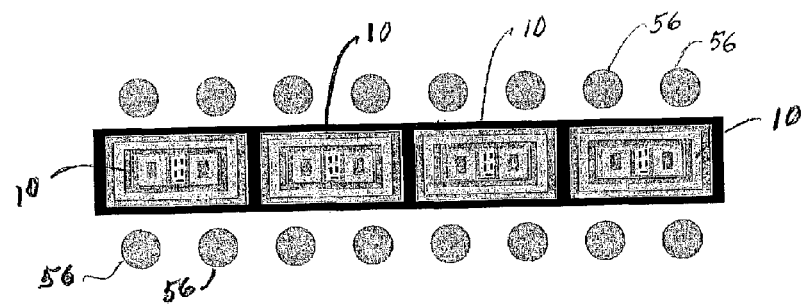
FIG. 7 is a top view of a semiconductor chip including a plurality of the circuits of FIG. 1.

FIG. 7 is a top view of a semiconductor chip including a plurality of the circuits 10 of FIG. 1. Also shown are a plurality of solder bumps 56 applied to the chip. The solder bumps 56 are preferably formed by etching a portion of the substrate to reveal a metallization layer which provides contact to the cathode and anode of each of the individual circuits 10 for coupling the anodes and cathodes to the leads of the devices to be protected. As can be seen, any number of circuits 10 can be fabricated on a single semiconductor chip, depending upon how many leads are to be protected.

From the foregoing description, it should be appreciated that circuits are provided for providing overvoltage protection for sensitive circuitry, such as circuitry in implantable medical devices that present significant benefits, which have been presented in the background of the invention, summary, brief description of the drawings, and detailed description of the drawings and also present significant benefits that would be apparent to one or ordinary skill in the art. Furthermore, while embodiments have been presented in the foregoing detailed description of the drawings, it should be appreciated that a vast number of variations in the embodiments exist. It should also be appreciated that these embodiments are preferred exemplary embodiments only, and are not intended to limit the scope, applicability, or configuration of the invention in any way. Rather, the foregoing detailed description provides those skilled in the art with a convenient road map for implementing a preferred exemplary embodiment of the invention. It being understood that various changes may be made in the function and arrangement of elements described in this detailed description of the drawings without departing from the spirit and scope of the invention as set forth in the appended claims.

What is claimed is:

1. A plurality of overvoltage protection devices formed in a semiconductor substrate having a plurality of doped regions for forming semiconductor devices, the overvoltage protection devices adapted to draw current away from a device to be protected from excess voltage, each overvoltage protection device comprising:
a switchable device having a terminal adapted to be coupled to a potential source of excess voltage and to the semiconductor substrate for drawing current away from the potential source of excess voltage when the switchable device being triggered and for directing the current to the semiconductor substrate; and
a Zener diode coupled to a second terminal of the switchable device to trigger the switchable device to a conducting state;
whereby current directed to the semiconductor substrate by a first overvoltage protection device causes the current to enter the semiconductor substrate wherein the switchable device of each circuit includes a silicon controlled rectifier, wherein the silicon controlled rectifier of each circuit includes an NPN transistor and a PNP transistor, the NPN transistor includes multiple emitters
the NPN transistor being formed as a series of concentric rings around the base of the NPN transistor,
wherein the semiconductor substrate includes a P-doped substrate overlaid by an N-epitaxial layer, and the Zener diode of each circuit being formed in a P-well in the N-epitaxial layer.

2. A plurality of overvoltage protection circuits as set forth in claim 1 wherein the NPN transistor of each circuit includes a vertical transistor and the PNP transistor includes a lateral transistor.

3. A plurality of overvoltage protection circuits as set forth in claim 1 wherein the trigger of each switchable device includes the base of the NPN transistor.

4. A plurality of overvoltage protection circuits as set forth in claim 1 wherein the layout of each circuit on the semiconductor substrate is symmetrical with respect to the Zener diode.

5. A plurality of overvoltage protection circuits as set forth in claim 4 wherein the symmetrical layout of each circuit includes the emitter of the NPN transistor being formed as a series of concentric rings around the base of the NPN transistor.

6. An overvoltage protection device comprising:
a switchable device having a terminal adapted to be coupled to a potential source of excess voltage and to a semiconductor substrate for drawing current away from the potential source of excess voltage when the switchable device being triggered and for directing the current to the semiconductor substrate;
a Zener diode coupled to a second terminal of the switchable device to trigger the switchable device to a conducting state;
a first transistor coupled to the Zener diode, the first transistor includes multiple emitters equidistant from the Zener diode; and
a second transistor coupled to the Zener diode,
the first transistor being formed as a series of concentric rings around the base of the first transistor,
wherein the semiconductor substrate includes a P-doped substrate overlaid by an N-epitaxial layer, and the Zener diode being formed in a P-well in the N-epitaxial layer.

7. An overvoltage protection circuit as set forth in claim 6 wherein the NPN transistor includes a vertical transistor and the PNP transistor includes a lateral transistor, each transistor having a base, an emitter, and a collector.

8. An overvoltage protection circuit as set forth in claim 6 wherein the trigger of the switchable device includes the base of the NPN transistor.

9. A plurality of overvoltage protection devices formed in a semiconductor substrate having a plurality of doped regions for forming semiconductor devices, the overvoltage protection devices adapted to draw current away from a device to be protected from excess voltage, each overvoltage protection device comprising:
a switchable device having a terminal adapted to be coupled to a potential source of excess voltage and to the semiconductor substrate for drawing current away from the potential source of excess voltage when the switchable device being triggered and for directing the current to the semiconductor substrate; and
a Zener diode coupled to a second terminal of the switchable device to trigger the switchable device to a conducting state;
whereby current directed to the semiconductor substrate by a first overvoltage protection device causes the current to enter the semiconductor substrate wherein the switchable device of each circuit includes a silicon controlled rectifier, wherein the silicon controlled rectifier of each circuit includes an NPN transistor and a PNP transistor, the NPN transistor includes multiple emitters, the NPN transistor being formed as a series of concentric rings around the base of the NPN transistor,
wherein the layout of each circuit on the semiconductor substrate is symmetrical with respect to the Zener diode.

* * * * *